United States Patent
Banno et al.

(10) Patent No.: US 9,443,654 B2
(45) Date of Patent: Sep. 13, 2016

(54) MULTILAYER CERAMIC ELECTRONIC COMPONENT AND METHOD FOR MANUFACTURING MULTILAYER CERAMIC ELECTRONIC COMPONENT

(71) Applicant: Murata Manufacturing Co., Ltd., Nagaokakyo-shi, Kyoto-fu (JP)

(72) Inventors: Koichi Banno, Nagaokakyo (JP); Shoichiro Suzuki, Nagaokakyo (JP); Taisuke Kanzaki, Nagaokakyo (JP); Akihiro Shiota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 161 days.

(21) Appl. No.: 14/102,594

(22) Filed: Dec. 11, 2013

(65) Prior Publication Data

US 2014/0175942 A1 Jun. 26, 2014

Related U.S. Application Data

(63) Continuation of application No. PCT/JP2012/064526, filed on Jun. 6, 2012.

(30) Foreign Application Priority Data

Jun. 17, 2011 (JP) .................. 2011-135284

(51) Int. Cl.
*H01G 4/30* (2006.01)
*H01G 4/005* (2006.01)
(Continued)

(52) U.S. Cl.
CPC ............. *H01G 4/008* (2013.01); *H01C 7/008* (2013.01); *H01F 5/003* (2013.01); *H01G 4/0085* (2013.01);
(Continued)

(58) Field of Classification Search
CPC ........ H01G 4/30; H01G 4/232; H01G 4/008; H01G 4/012
USPC ................... 361/321.1, 301.4, 303
See application file for complete search history.

(56) References Cited

U.S. PATENT DOCUMENTS

| | | | |
|---|---|---|---|
| 5,835,339 A | 11/1998 | Sakamoto et al. | |
| 6,069,786 A * | 5/2000 | Horie | H01G 4/255 29/25.42 |
| 2011/0075318 A1* | 3/2011 | Suzuki et al. | 361/303 |

FOREIGN PATENT DOCUMENTS

| | | |
|---|---|---|
| JP | 64-053519 A | 3/1989 |
| JP | 11-003834 A | 1/1999 |

(Continued)

OTHER PUBLICATIONS

Official Communication issued in International Patent Application No. PCT/JP2012/064526, mailed on Sep. 11, 2012.

*Primary Examiner* — Eric Thomas
*Assistant Examiner* — Arun Ramaswamy
(74) *Attorney, Agent, or Firm* — Keating & Bennett, LLP

(57) ABSTRACT

A multilayer ceramic electronic component achieves a high electrostatic capacitance and includes an Al inner electrode superior in smoothness and conductivity. The multilayer ceramic electronic component includes a multilayer body including a plurality of stacked ceramic layers and a plurality of inner electrodes arranged along certain interfaces between the ceramic layers and containing Al as a main component, and an outer electrode located on an outer surface of the multilayer body. A surface of the inner electrode is covered with a layer including a noble metal or Ti as a main component.

14 Claims, 1 Drawing Sheet

(51) Int. Cl.
  $H01G\ 4/06$ (2006.01)
  $H01G\ 4/232$ (2006.01)
  $H01G\ 4/008$ (2006.01)
  $H01C\ 7/00$ (2006.01)
  $H01F\ 5/00$ (2006.01)
  $H01L\ 41/083$ (2006.01)
  $H05K\ 1/09$ (2006.01)
  $H01G\ 4/12$ (2006.01)

(52) U.S. Cl.
  CPC .............. *H01G 4/1209* (2013.01); *H01G 4/30* (2013.01); *H01L 41/083* (2013.01); *H05K 1/09* (2013.01); *H01G 4/1227* (2013.01)

(56) References Cited

FOREIGN PATENT DOCUMENTS

| | | |
|---|---|---|
| JP | 2008-229849 A | 10/2008 |
| JP | 2011-097016 A | 5/2011 |

\* cited by examiner

MULTILAYER CERAMIC ELECTRONIC COMPONENT AND METHOD FOR MANUFACTURING MULTILAYER CERAMIC ELECTRONIC COMPONENT

BACKGROUND OF THE INVENTION

1. Field of the Invention

The present invention relates to a multilayer ceramic electronic component such as a multilayer ceramic capacitor, for example, and more particularly to a multilayer ceramic electronic component including an inner electrode including Al as a main component.

2. Description of the Related Art

Firstly, referring to FIG. 1, a multilayer ceramic capacitor 1 as a typical example of a multilayer ceramic electronic component will be described.

Multilayer ceramic capacitor 1 includes a multilayer body 2 constituted by stacked dielectric ceramic layers 3 and a plurality of inner electrodes 4 and 5 formed along certain interfaces between dielectric ceramic layers 3.

In multilayer ceramic capacitor 1 shown in FIG. 1, a first outer electrode 8 and a second outer electrode 9 are formed respectively on opposing end surfaces of multilayer body 2. Inner electrodes 4 and 5 include a plurality of first inner electrodes 4 electrically connected to first outer electrode 8 and a plurality of second inner electrodes 5 electrically connected to second outer electrode 9. These first inner electrodes 4 and second inner electrodes 5 are arranged alternately in the layered direction.

Since miniaturization of a multilayer ceramic capacitor is particularly demanded, a method of layering a green sheet of dielectric ceramic and an inner electrode layer and thereafter firing those concurrently is employed in the manufacturing process. In recent years, a base metal such as Ni is employed in an inner electrode of a multilayer ceramic capacitor for cost reduction.

However, since Ni is very liable to be oxidized when co-sintered with ceramic, it was necessary to precisely control a temperature condition and an oxygen partial pressure under a reductive atmosphere as an atmosphere in the stage of firing. As a result, the material design was greatly limited. Additionally, the problems of delaminations, cracks, and the like due to an uneven stress along with co-firing occurred.

Therefore, inner electrodes of various metal species were considered to try to improve a degree of freedom in designing a multilayer ceramic electronic component.

For example, Japanese Patent Laying-Open No. 2011-97016 describes a multilayer ceramic body employing Al in place of Ni as an inner electrode material, and mechanical characteristics and electrical characteristics are improved by forming an $Al_2O_3$ film on a surface portion of the Al inner electrode.

A larger capacitance is desired increasingly for a multilayer ceramic capacitor as a typical multilayer ceramic electronic component. In such a case, the multilayer ceramic electronic component disclosed in Japanese Patent Laying-Open No. 2011-97016 had a problem that an electrostatic capacitance of the multilayer ceramic electronic component becomes scant due to low permittivity of the $Al_2O_3$ film present in the interface between the ceramic layer and the Al inner electrode.

SUMMARY OF THE INVENTION

In view of the above, preferred embodiments of the present invention provide a multilayer ceramic electronic component exhibiting a high electrostatic capacitance while having an Al inner electrode superior in smoothness and conductivity.

In other words, various preferred embodiments of the present invention relate to a multilayer ceramic electronic component including a multilayer body including stacked ceramic layers and a plurality of inner electrodes arranged along certain interfaces between the ceramic layers and containing Al as a main component, and an outer electrode located on an outer surface of the multilayer body, and a surface of the inner electrode is covered with a layer containing a noble metal or Ti as a main component.

Preferably, the noble metal is Ag, for example.

Further, preferably, the main component of the ceramic layer is a titanate barium-based perovskite compound, and the multilayer ceramic electronic component is a multilayer ceramic capacitor. In this case, a permittivity of the ceramic layer becomes high and contributes to the improvement of an electrostatic capacitance.

Further, preferably, the ceramic layer further includes oxide containing Bi such as $Bi_2O_3$ as an accessory component. In this case, low-temperature sintering can be performed, so that coverage of the inner electrode is improved to contribute to the improvement of the electrostatic capacitance.

According to various preferred embodiments of the present invention, since a thickness of an $Al_2O_3$ layer located on a surface portion of the Al inner electrode is significantly reduced to a very low thickness or a minimum thickness required to maintain the mechanical characteristics, an influence exerted to the electrostatic capacitance by low permittivity of the $Al_2O_3$ layer is reduced. Therefore, a multilayer ceramic electronic component having a high electrostatic capacitance is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In a multilayer ceramic electronic component according to a preferred embodiment of the present invention, an inner electrode thereof contains Al as a main component. This inner electrode may be made of either Al alone or an Al alloy, for example. In the case of an Al alloy, a content ratio of Al is preferably about 70% by mole or higher, and more preferably about 90% by mole or higher, for example.

Figure 1:
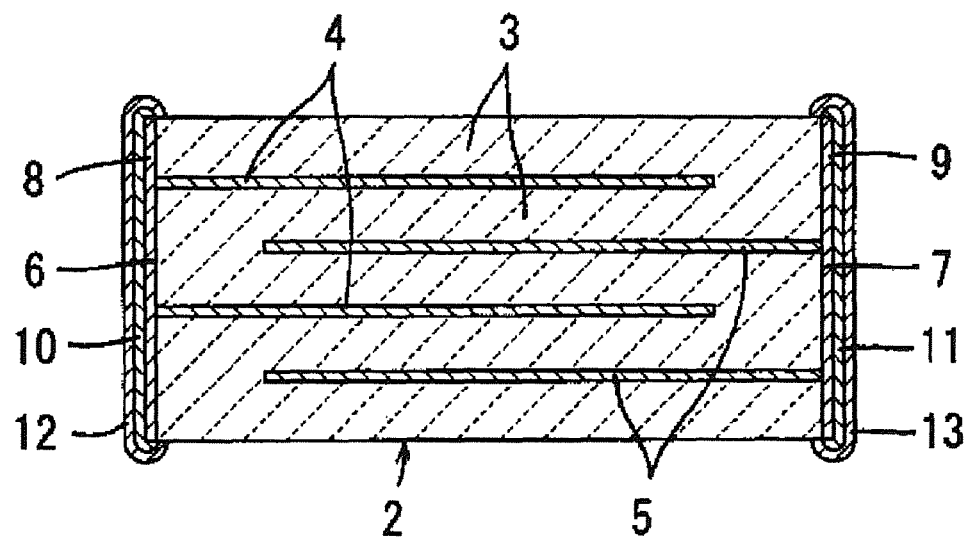
FIG. 1 represents a cross section of a multilayer ceramic capacitor as an example of a multilayer ceramic electronic component of the present invention.
Figure 2:
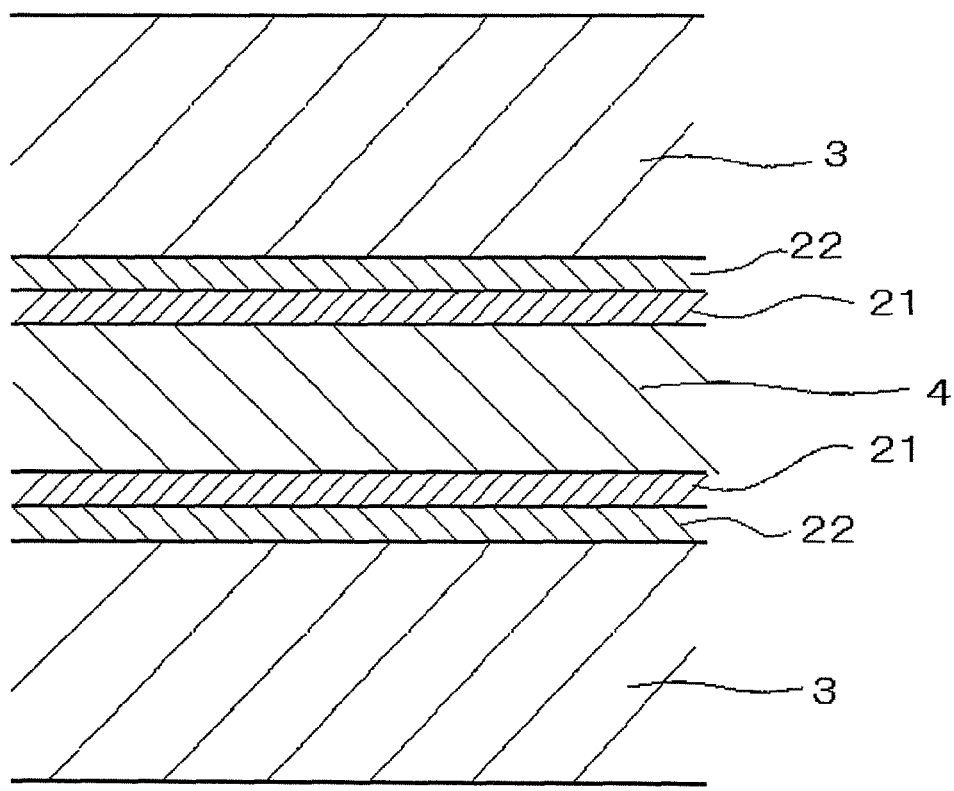
FIG. 2 represents an enlarged view of a cross section of the multilayer ceramic capacitor as an example of the multilayer ceramic electronic component according to a preferred embodiment of the present invention.

FIG. 2 represents an enlarged view of a cross section of the multilayer ceramic capacitor as an example according to a preferred embodiment of the present invention. As to the inner electrodes, a periphery of inner electrode 4 is illustrated as a representative among inner electrodes 4 and 5.

On the surfaces of inner electrode 4 containing Al as a main component, $Al_2O_3$ layers 21 are often present. This is mainly because the surfaces of Al inner electrode 4 are oxidized. $Al_2O_3$ layers 21 serve to smooth Al inner electrode 4, thus preventing or significantly reducing delamination between ceramic layers 3 and Al inner electrode 4. In view of the above, the thickness of $Al_2O_3$ layer 21 is preferably about 0.25% or greater of the thickness of the inner electrode, for example. However, as previously described, it is preferable to significantly reduce the thickness of $Al_2O_3$ layer 21 to be as small as possible to secure an electrostatic capacitance.

Further, at interfaces between the Al inner electrode 4 and ceramic layers 3, layers 22 including a noble metal or Ti as a main component are preferably provided. Layers 22 containing a noble metal or Ti as a main component prevent or significantly reduce oxidization of Al inner electrode 4 and prevent or significantly reduce an increase in the thickness of $Al_2O_3$ layer 21. Although Ag is known as a typical noble metal, other metals such as Pd, Au, Pt, or an alloy of these metals may be used, for example.

Next, an example of a method for manufacturing a multilayer ceramic electronic component according to a preferred embodiment of the present invention will be described referring to a multilayer ceramic capacitor as an example.

Firstly, ceramic raw material is prepared. This ceramic raw material is mixed with an organic binder component in a solvent as needed to obtain a ceramic slurry. This ceramic slurry is shaped into a sheet to obtain a ceramic green sheet.

Next, layer 22 containing a noble metal or Ti as a main component is formed on the ceramic green sheet. Various methods may be used for this procedure, and the method of performing screen-printing to allow paste containing a noble metal powders or Ti powders and organic vehicle to have a desired pattern is convenient. Methods other than those described above may be used, such as the method of transferring foil prepared in advance or the method of forming a film with use of the vacuum thin film forming method.

Next, a layer of Al inner electrode 4 is formed on layer 22 containing a noble metal or Ti as a main component. This procedure may also include the method of applying Al paste, the method of transfer, the vacuum thin film forming method, and the like.

Then, layer 22 containing a noble metal or Ti as a main component is formed again on the layer of Al inner electrode 4.

As described above, a plurality of layers are stacked in the order of the ceramic green sheet, layer 22 containing noble metal or Ti as a main component, layer 4 of the Al inner electrode, and layer 22 containing a noble metal or Ti as a main component, and then the layers are press-bonded, so that a non-fired raw multilayer body can be obtained.

This raw multilayer body is fired in a furnace under a predetermined atmosphere and temperature. For example, when an oxygen partial pressure of $1 \times 10^{-4}$ MPa or higher and a firing temperature of 600° C. or higher are provided during the firing, oxidization on the surface of Al inner electrode 4 progresses, so that $Al_2O_3$ layer 21 having an appropriate thickness is created. Further, for example, when the firing temperature of 1000° C. or lower is provided, spheroidizing of Al inner electrodes 4 is effectively prevented. With regard to the oxygen partial pressure, an atmospheric pressure is the most preferable, taking in consideration the convenience of the procedures.

In this stage, layer 22 containing a noble metal or Ti as a main component reduces contact between Al inner electrodes and oxygen, so that oxidization of Al inner electrode 4 is suppressed to a desired extent or smaller. When Ti is used for layers 22 containing a noble metal or Ti as a main component, the $TiO_2$ layer may be formed on the surface of Ti by sintering. However, it does not exert any influence on lowering of the electrostatic capacitance since this $TiO_2$ layer has a low insulation property.

The ceramic composition in the multilayer ceramic electronic component according to a preferred embodiment of the present invention is not particularly limited. Various materials such as a titanate barium-based material (including those substituted by Ca, Sr, Zr, and the like), a lead titanate-based material, a lead titanate zirconate-based material, or an alumina-based glass ceramic material, a ferrite, a transition-metal oxide-based semiconductor ceramic material, and the like may be used within a range that still achieves the advantages of preferred embodiments of the present invention.

The multilayer ceramic electronic component of the present invention is not limited to a multilayer ceramic capacitor, and it is also applicable to various electronic components such as a multilayer piezoelectric element, a multilayer thermistor element, a multilayer chip coil, a ceramic multilayer substrate, and the like, for example.

EXAMPLES

The present example shows influence of a metal species and thickness of a layer covering the Al inner electrode in an example of a multilayer ceramic capacitor including titanate barium-based ceramic and Al inner electrode according to a preferred embodiment of the present invention.

Firstly, $BaTiO_3$ powder was prepared as a main component of ceramic, and powders of $Bi_2O_3$ and $BaCO_3$ were prepared as auxiliary components. These powders were mixed to have the composition of $100BaTiO_3+3Bi_2O_3+2BaCO_3$ to obtain ceramic raw material.

An ethanol-based organic solvent and a polyvinyl butyral-based binder were added to the ceramic raw material and wet-mixed in a ball mill to obtain a ceramic slurry. This ceramic slurry was shaped into a sheet, so that a ceramic green sheet was obtained.

Next, films of metals shown in Table 1 were formed on the ceramic green sheet by the vacuum vapor deposition method so as to have the thicknesses shown in Table 1. Then, the layers of the Al inner electrode were formed by the vacuum vapor deposition to have a thickness of 0.6 μm. Further, the films of metals shown in Table 1 were formed thereon similarly by the vacuum vapor deposition method to have the thicknesses shown in Table 1.

The green sheets obtained in this manner, having the Al inner electrode covered with the metal film shown in Table 1, were layered so that the drawn sides of the Al inner electrodes are alternated, and then press-bonded. Accordingly, a raw multilayer body was obtained.

This raw multilayer body was heated in the atmosphere at 270° C. to remove the binder. Thereafter, the temperature was raised at a temperature rising rate of 100° C./min, and firing was performed at 650° C. for 1 hour. Ag paste containing a low melting point glass frit was applied to both end surfaces of the obtained multilayer body, and baked at 600° C. in the atmosphere to have outer electrodes connected with the inner electrodes.

The multilayer ceramic capacitor obtained in the manner described above had a length of about 2.0 mm, a width of about 1.0 mm, and a thickness of about 0.5 mm, for example. A ceramic layer thickness was about 50 μm, for example. A thickness of the Al inner electrode layer was about 0.6 µm, for example. The number of effective layers was 5, for example.

As to the obtained test samples, an electrostatic capacitance was measured with use of an automatic bridge-type measuring instrument. The result is shown in Table 1. Further, the cross section obtained by the FIB processing is analyzed using the µ-SAM, and the $Al_2O_3$ layer at the cross section of the inner electrode was identified. The thickness of the $Al_2O_3$ layer was measured at appropriate ten points, and the average thickness was calculated. The results are shown together in Table 1.

TABLE 1

| Test Sample No. | Metal Species of Covering Layer | Covering Thickness of Covering Layer | Thickness of $Al_2O_3$ Layer | Electrostatic Capacitance (pF) |
|---|---|---|---|---|
| 1 | None | — | 60 nm | 2318 |
| 2 | Ag | 20 nm | 20 nm | 2738 |
| 3 | Ag | 10 nm | 20 nm | 2725 |
| 4 | Ag | 5 nm | 20 nm | 2713 |
| 5 | Ti | 20 nm | 20 nm | 2732 |
| 6 | Ti | 5 nm | 20 nm | 2701 |
| 7 | Ni | 20 nm | 60 nm | 2327 |

According to the result of Table 1, the Al inner electrode having a high electrostatic capacitance was obtained in the test samples of Test Sample Nos. 2-6 covered with Ag and Ti.

As to the test sample of Test Sample No. 1 having the Al inner electrode not covered with metal, expected electrostatic capacitance could not be obtained due to the influence of large thickness of the $Al_2O_3$ layer.

As to the test sample of Test Sample No. 7 having the Al inner electrode covered with Ni, expected electrostatic capacitance could not be obtained. It seems that such result was obtained because all of the Ni as the covering metal was oxidized, and oxidization of the Al inner electrode progressed therefrom, so that the thickness of the $Al_2O_3$ layer became greater as a result.

A multilayer ceramic electronic component according to various preferred embodiments of the present invention is applicable to a multilayer ceramic capacitor, a multilayer piezoelectric element, a multilayer thermistor, a multilayer chip coil, a ceramic multilayer substrate, and the like, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component, comprising:
    a multilayer body including stacked ceramic layers and a plurality of inner electrodes arranged along interfaces between the ceramic layers and including Al as a main component;
    an outer electrode located on an outer surface of the multilayer body; and
    a layer arranged to cover a main surface of at least one of the plurality of inner electrodes and consisting essentially of a noble metal or Ti; wherein
    the layer arranged to cover the main surface of at least one of the plurality of inner electrodes is provided in a plurality, and a pair of the layers are arranged respectively above and below the at least one of the plurality of inner electrodes.

2. The multilayer ceramic electronic component according to claim 1, wherein the noble metal is Ag.

3. The multilayer ceramic electronic component according to claim 1, wherein a main component of each of the ceramic layers is a titanate barium-based perovskite compound.

4. The multilayer ceramic electronic component according to claim 1, wherein the multilayer ceramic electronic component is a multilayer ceramic capacitor.

5. The multilayer ceramic electronic component according to claim 1, wherein each of the ceramic layers further includes an oxide containing Bi as an auxiliary component.

6. The multilayer ceramic electronic component according to claim 1, wherein the plurality of inner electrodes include an Al alloy.

7. The multilayer ceramic electronic component according to claim 1, wherein a content ratio of Al in each of the plurality of inner electrodes is about 70% by mole or higher.

8. The multilayer ceramic electronic component according to claim 1, wherein a content ratio of Al in each of the plurality of inner electrodes is about 90% by mole or higher.

9. The multilayer ceramic electronic component according to claim 1, further comprising $Al_2O_3$ layers disposed on the inner electrodes.

10. The multilayer ceramic electronic component according to claim 9, wherein a thickness of the $Al_2O_3$ layers is about 0.25% or greater of a thickness of the inner electrodes.

11. The multilayer ceramic electronic component according to claim 1, wherein the noble metal is one of Pd, Au, Pt and an alloy of one of Pd, Au, and Pt.

12. The multilayer ceramic electronic component according to claim 1, wherein the multilayer ceramic electronic component is made of at least one of a titanate barium-based material, a lead titanate-based material, a lead titanate zirconate-based material, an alumina-based glass ceramic material, a ferrite, and a transition-metal oxide-based semiconductor ceramic material.

13. The multilayer ceramic electronic component according to claim 1, wherein the multilayer ceramic electronic component is one of a multilayer ceramic capacitor, a multilayer piezoelectric element, a multilayer thermistor element, a multilayer chip coil, and a ceramic multilayer substrate.

14. The multilayer ceramic electronic component according to claim 1, wherein pairs of the layers are arranged above and below each respective one of the plurality of inner electrodes.

* * * * *